United States Patent
Hintermaier

(10) Patent No.: US 6,258,153 B1
(45) Date of Patent: Jul. 10, 2001

(54) DEVICE FOR THE DEPOSITION OF SUBSTANCES

(75) Inventor: Frank Hintermaier, München (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/335,561

(22) Filed: Jun. 18, 1999

(30) Foreign Application Priority Data

Jul. 9, 1998 (DE) .............................................. 198 30 842

(51) Int. Cl.$^7$ ...................................................... B01D 8/00
(52) U.S. Cl. .......................... 95/267; 95/288; 55/434.1; 55/434.2; 55/465; 55/DIG. 15
(58) Field of Search ................... 55/434.1, 434.2, 55/462, 465, DIG. 15; 62/617, 640, 641, 642; 95/267, 272, 288

(56) References Cited

U.S. PATENT DOCUMENTS 2,465,229 * 3/1949 Hipple, Jr. ..................... 55/DIG. 15
4,488,887 * 12/1984 Angel et al. ..................... 55/DIG. 15
4,647,338    3/1987 Visser .

FOREIGN PATENT DOCUMENTS 2354435    9/1974 (DE) .
3404802A1  8/1984 (DE) .

* cited by examiner

Primary Examiner—David A. Simmons
Assistant Examiner—Robert A. Hopkins
(74) Attorney, Agent, or Firm—Herbert L. Lerner; Laurence A. Greenberg; Werner H. Stemer

(57) ABSTRACT

The device enables the deposition of substances from a gas phase. The device has a deposition chamber with at least one inner wall that is maintained at a deposition temperature for the deposition of the substances. A delivery end of a feed line extends to or into the deposition chamber. The substances to be deposited in the deposition chamber are delivered in gas form via the feed line. The feed has a transport temperature above the deposition temperature. This transport temperature is selected such that premature deposition of the substances inside the feed is prevented. A thermal insulation is formed between the feed and the inner wall of the deposition chamber. Any cooling of the feed toward its delivery end down to the deposition temperature is thereby prevented.

12 Claims, 3 Drawing Sheets

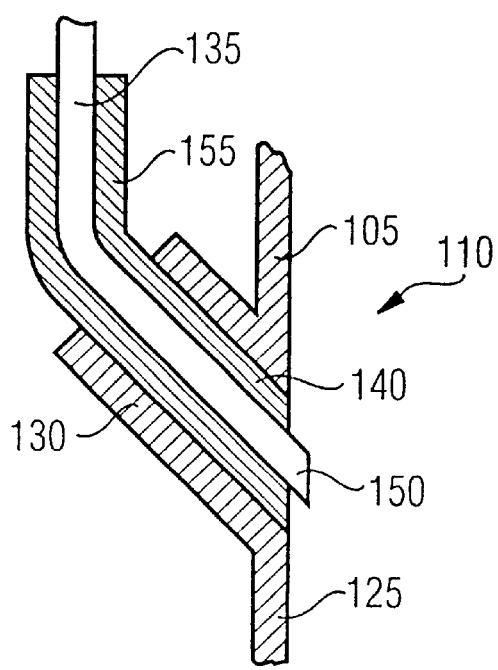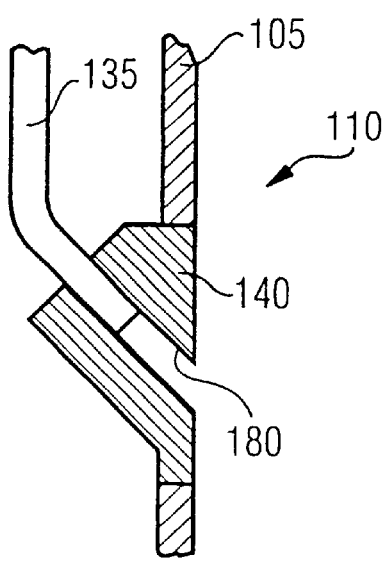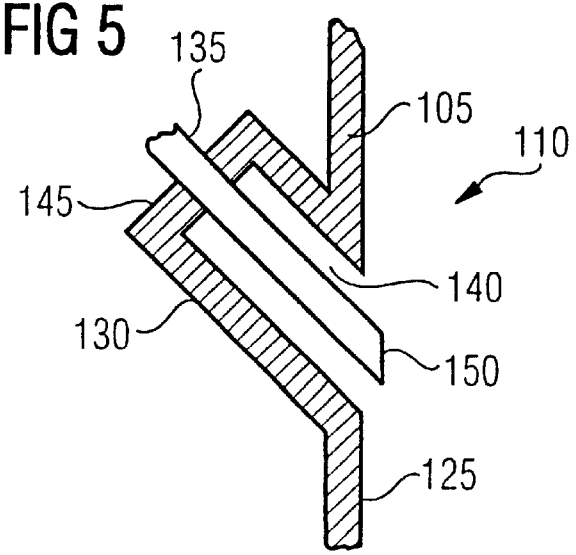

DEVICE FOR THE DEPOSITION OF SUBSTANCES

BACKGROUND OF THE INVENTION

FIELD OF THE INVENTION

The invention relates to the field of process engineering, and concerns a device for the deposition of substances from a gas phase.

In the production of semiconductor components, CVD processes (CVD=chemical vapor deposition) are commonly used for applying layer structures to semiconductor substrates. In these CVD processes, a plurality of reaction partners are introduced into a reaction chamber of a reactor using a carrier gas. The reaction partners, also referred to as initial products or precursor compounds, may be fed to the reaction chamber via one or more feed lines. In addition, other gases, e.g. oxidizing agents ($O_2$) or inert gases ($N_2$, Ar) are usually introduced into the reaction chamber in order to dilute the reaction partners. The reaction partners and oxidizing agents introduced react with one another to form the desired layer. This takes place on the surface of a semiconductor substrate placed in the reaction chamber. By varying the initial concentration of the reaction partners, the stoichiometric ratio of the individual constituents of the layers which are formed can be adjusted. In the deposition of metal oxide ceramics, e.g. $SrBi_2Ta_2O_9$ (SBT) or $(Ba,Sr)TiO_3$ (BST), which are employed for memory applications in the semiconductor industry, the reaction partners or initial products predominantly consist of metal complexes which are in gas form at elevated temperatures. In order to prevent the unused initial products from reaching downstream pumps or the surroundings, downstream cold traps for collecting unused initial products are used in the reaction chamber. These are intended to remove the initial products as fully as possible from the gas flowing through the cold traps.

A deposition system of the foregoing type is described, for example, in U.S. Pat. No. 4,647,338 to Jan Visser. In the process disclosed there for the production of a semiconductor component, a CVD system consisting of a reaction chamber and a downstream cold trap are used. A disadvantage, however, is that in that system deposition of unused initial products can actually take place even before, i.e., upstream of, the cold trap, which may cause clogging of feed lines and the like.

SUMMARY OF THE INVENTION

It is accordingly an object of the invention to provide a device for depositing substances, which overcomes the above-mentioned disadvantages of the heretofore-known devices and methods of this general type and which avoids the premature deposition of the substances.

With the foregoing and other objects in view there is provided, in accordance with the invention, a device for depositing substances, such as a cold trap, comprising:

a housing having a deposition chamber with an inner wall maintained at a given deposition temperature for depositing substances thereon;

a feed having a delivery end extending to the deposition chamber for introducing the substances to be deposited into the deposition chamber, the feed being maintained at a transport temperature above the given deposition temperature, wherein a deposition of the substances is substantially prevented at the transport temperature;

the deposition chamber being formed with an outlet opening; and a thermal insulation between the feed and the inner wall for preventing the delivery end of the feed from being cooled to the given deposition temperature.

In other words, the objects of the invention are satisfied with the device in which at least one inner wall of the deposition chamber is provided with a predetermined deposition temperature for the deposition of the substances on this inner wall and in which the feed, maintained at a transport temperature above the deposition temperature so that the substances are not deposited, is thermally insulated from the inner wall. This prevents the feed from being cooled toward its delivery end down to the deposition temperature.

The substances to be deposited are, for example, initial products for a CVD process which are dispersed in a carrier gas. These are transported into the deposition chamber via the feed using the carrier-gas flow. In order to prevent premature deposition of the substances, the feed has an elevated transport temperature. The transport temperature is customarily significantly above the deposition temperature of the inner wall. In order to prevent or reduce a temperature gradient along the feed as far as its delivery end, thermal insulation is arranged between the feed and the inner wall. The effect achieved by this is that the delivery end has a temperature above the deposition temperature, so that premature deposition of the substances there is effectively prevented. The temperature gradient between the cool inner wall and the hot feed falls, according to the invention, primarily through the thermal insulation. It is therefore not until after entering the deposition chamber that the incoming substances come into contact with the cool walls (inner wall) and are not fully deposited until then.

Preferably, the thermal insulation even prevents cooling of the delivery end to below the transport temperature, i.e. the feed is at the transport temperature as far as its delivery end.

In the simplest embodiment, the feed is formed by a tube that extends all the way to the deposition chamber. The tube may be designed in one or more parts. Expediently, there is also an inlet bore in the thermal insulation for introducing the substances, the inlet bore being in this case part of the feed. Preferably, the feed is enclosed by a heater, which may also extend as far as the delivery end.

In accordance with an added feature of the invention, the deposition chamber has a connector on its outside, into which the feed protrudes with its delivery end as far as the deposition chamber and is thermally insulated from the connector.

Owing to the connector holding the feed on the outside of the deposition chamber, the temperature gradient is partially fed through this connector. At its opposite end from the deposition chamber, the connector may also enter into direct contact with the feed. At that point of contact, the connector is therefore at the transport temperature. Conversely, at its end next to the deposition chamber, it is at a significantly lower temperature, which is between the transport temperature and the deposition temperature. So that the temperature gradient along the connector is not imparted to the feed, thermal insulation is preferably arranged between the latter and the connector.

The inner wall of the deposition chamber, which is at the deposition temperature, may be formed either by the inside of the deposition chamber or by separate surfaces arranged inside the deposition chamber. It has proved advantageous for the delivery end to protrude to a certain extent into the deposition chamber. If, in spite of the thermal insulation, substances are already deposited at the delivery end, then they can drain off from there without wetting the inner wall. Because of the high transport temperature, the substances condense there as a liquid. As a result, possible solidification of the substances in the immediate vicinity of the delivery end, and therefore clogging of the feed, are advantageously avoided.

In accordance with another feature of the invention, a heater is provided around the connector or between the connector and the feed.

For reliable temperature control of the feed, a heater is provided either between it and the connector or around the connector on its outside. If the heater is provided between the feed and the connector, it serves as thermal insulation at the same time.

A further advantageous embodiment is wherein the feed is fed downward to the deposition chamber.

Owing to the feed directed at a slant to the deposition chamber, it is easier for substances which may already have been deposited to flow away inside the feed. Since a deposition process is always subject to a temperature-dependent distribution between the substance which has already been deposited and that which is still in gas form, even when there is a very elevated transport temperature some degree of deposition may still occur inside the feed. The amount deposited is, however, generally negligibly small compared with the amount in gas form, so that there is no macroscopically observable build-up.

In accordance with a further advantageous embodiment of the invention, a partition is formed in the deposition chamber between the feed and the outlet opening.

By means of the partition, the gas flow is deflected inside the deposition chamber. What is essential in this case is that the substances still in gas form remain for a relatively long time in the deposition chamber, so that they can cool and precipitate as fully as possible on the inner wall of the deposition chamber. Investigations have shown that the majority of these substances actually precipitate on the partition opposite the feed. The substances in gas form accordingly impact on the partition when flowing into the deposition chamber and solidify there.

It is further advantageous if the transport temperature is above the evaporation temperature and the deposition temperature is below the melting temperature of the substances to be deposited.

If appropriate, the deposition temperature may also be between the melting temperature and the evaporation temperature of the substances to be deposited. As a result, the deposited substances are in liquid form and can be taken continuously from the deposition chamber.

Further, the device according to the invention can also be used for the purification of gases. In this case, its application is not restricted to use as a cold trap downstream of a CVD reactor. The device according to the invention has also proved advantageous for the purification of process gases before they are used. The device according to the invention can even be used effectively for the drying of air.

The device according to the invention is fundamentally distinguished by its high reliability and its favorable maintenance requirements, since owing to the proposed configuration of the feed, clogging of the latter is effectively prevented.

The substances to be deposited may either be in the form of a gas or in the form of finely dispersed aerosols at the transport temperature. If they are in gas form, then deposition from the gas phase takes place. If aerosols are employed, the finely dispersed aerosol droplets or aerosol particles wet the cool inner wall and are thus removed from the carrier flow.

Further, the device according to the invention can also be used to remove substances from a liquid flow. The prerequisite for this is that the substances to be deposited are in solid form at the deposition temperature. Preferably, however, substances in gas form are deposited using the device according to the invention.

In accordance with again another feature of the invention, the deposition temperature is preselected in such a way that at least one initial product needed for the formation of oxide ceramics can be deposited on the inner wall.

The device according to the invention is outstandingly suitable for the deposition of substances having a low vapor pressure. Such substances precipitate relatively rapidly on cold surfaces. It is therefore necessary, in particular in the case of these substances, to avoid temperature gradients in the transition between hot and cool surfaces. This is advantageously made possible through the device according to the invention. According to the invention, the temperature gradient does not arise along the feed but only inside the thermal insulation between the feed and the deposition chamber. As a result, the initial products used for the production of oxide ceramics, which have a low vapor pressure, are also fed constantly in a feed kept at the transport temperature until reaching the deposition chambers. Only after leaving the feed are these substances deposited on the cool inner wall. This prevents premature deposition and therefore loss of material or the risk of clogging the feed.

The temperature gradient which is inevitably created between the hot feed and the cool inner wall is, according to the invention, always kept outside the feed.

Preferably, the deposition temperature for the deposition of initial products which are used for the formation of oxide ceramics is below 160° C. A deposition temperature of below 150° C. is favorable. The transport temperature should, however, be below the decomposition temperature of the substances in gas form to be deposited. The transport temperature is preferably between 200° C. and 240° C.

These initial products comprise at least one of the substances listed below $BiPh_3$, $Bi(thd)_3$, $Ti(thd)_2$ $(OiPr)_2$, $Ti(OiPr)_4$, $Ti(O)(thd)_2$, $Ta(thd)$ $(OiPr)_4$, $Ta(OEt)_5$, $Pd(thd)_2$, $Zr(thd)_4$, $Zr(OtBu)_4$, $M(thd)_2(R)$ , $M(thd)_2$ where M stands for barium or strontium, Ph stands for phenyl, thd stands for 2,2,6,6-tetramethylheptane-3,5-dionate, OiPr stands for isopropoxide, OEt stands for ethoxide, OtBu stands for tertiary butoxide, and R stands for bis-(2-(2-methoxyethyl)ethyl) ether or N,N,N',N",N"-pentamethyl-bis-(2-aminoethyl)-amine.

These initial products are used for the production of strontium bismuth tantalate ($SrBi_2Ta_2O_9$), bismuth titanium oxide ($Bi_4Ti_3O_{12}$), lead zirconium titanate (Pb (Zr, Ti)$O_3$) and barium strontium titanate (Ba, Sr)$TiO_3$.

For example, $Sr(thd)_2$ has a melting point of about 78° C., $BiPh_3$ of about 80° C. and $Bi(thd)_3$ of about 135° C.

Other features which are considered as characteristic for the invention are set forth in the appended claims.

Although the invention is illustrated and described herein as embodied in a device for the deposition of substances, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 is a partial sectional view of a first embodiment of a feed connector;

FIG. 4 is a partial sectional view of a second embodiment of a feed connector; and FIG. 5 is a partial sectional view of a third embodiment of a feed connector.

DESCRIPTION OF THE PREFERRED EMBODIMENTS

Figure 1:
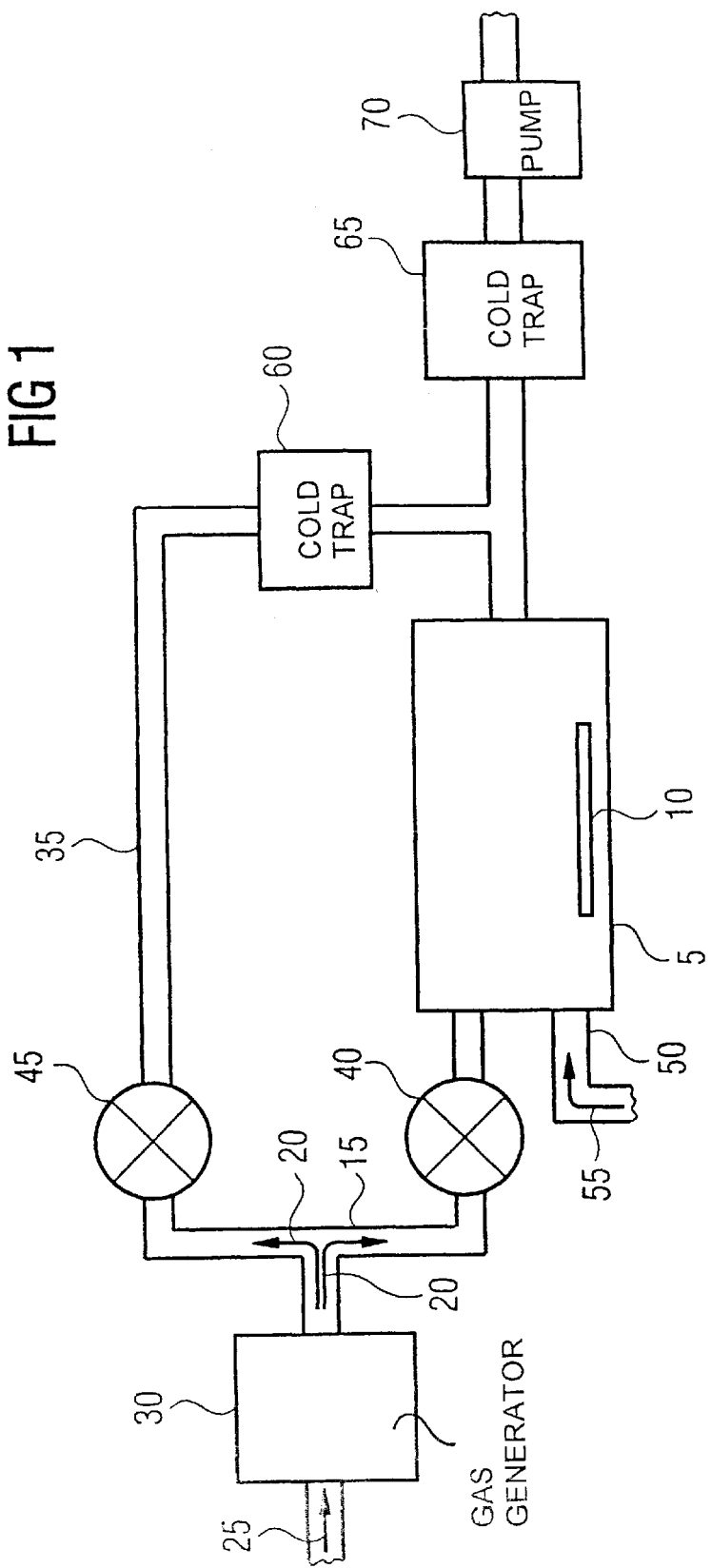
FIG. 1 is a diagrammatic view of a deposition system.

Referring now to the figures of the drawing in detail and first, particularly, to FIG. 1 thereof, the description will first concentrate on a CVD deposition in general, so as to provide a basic understanding thereof. The deposition system essentially comprises a reactor 5 with a reaction chamber in which a substrate 10 is received. Via transport lines 15, the process gases 20 are fed to the reactor 5. The process gases 20 consist of a mixture of individual initial materials dispersed in a carrier gas 25. The carrier gas 25 flows to that end firstly through a gas generation system 30, in which the initial products are evaporated. This may be done, for example, in a battery of a plurality of so-called bubblers or substantially more simply and reliably, in a so-called flash evaporator. In the latter case a liquid solution of all the initial products is instantaneously evaporated together. After evaporation, the initial products which are at this point in gas phase are transported by the carrier gas 25 to the reactor 5.

It is also possible to feed the process gases 20 past the reactor 5 via a bypass line 35. This circumvention of the reactor 5 is necessary, in particular, wherever the substrate 10 to be processed is to be taken from the reactor 5 or put in the latter. Temporary diversion of the process gases 20 is further recommendable when idling or for maintenance work. Since the generation of the process gases 20 in the gas generation system 30 is generally a continuous operation in process engineering terms, the filling of the reactor 5 with the process gases 20 needs to be carried out by coordinated opening and closing of the transport lines 15 and the bypass line 35, respectively. This may be done for example using the valves 40 and 45 arranged in the respective lines 15 and 35. Via a further line 50, it is also possible to bring additional process gases 55 into the reactor 5. This is necessary, in particular, in the case of highly reactive process gases which should only enter into contact with one another in the reactor 5. One example of this is the deposition of metal oxide ceramics, in which the process gases 20 should only enter into contact with an oxidant, e.g. $O_2$ or $N_2O$, in the reactor 5 and undergo combustion there. The additional process gases 55 are in this case a mixture of a transport gas and the oxidant. In addition, the process gases 55 may also contain inert gases e.g. $N_2$ or Ar, or consist only of the latter.

Cold traps 60 and 65 are downstream of the reactor 5 and the bypass line 35. These cold traps 60 and 65 represent the device according to the invention for the deposition of substances from a gas phase. In them, the unused process gases 20 and 55, in particular the initial products evaporated in the gas generation system 30, are trapped and removed from the carrier gas 25.

Expediently, the initial products should condense in the cold traps 60 and 65, so that only the transport gas 25 leaves the cold traps 60 and 65 and can be taken off using the downstream pump 70. The transport gas 25 preferably consists of inert gases such as argon or nitrogen. The pump 70 is frequently not only used for taking off the gases from the reactor 5 and the cold traps 60 and 65, but is also responsible for maintaining a working pressure which is generally set below atmospheric pressure. The working pressure is customarily below $10^3$ Pa.

The use of the cold trap 60 in the bypass line 35 is recommended since the process gases 20 flowing through the bypass line 35 are almost 100% unused, and mixing with used process gases from the reactor 5 is undesirable. The unused process gases 20 condensed in the cold trap 60 will then no longer expensively need to have process residues separated from them.

Figure 2:
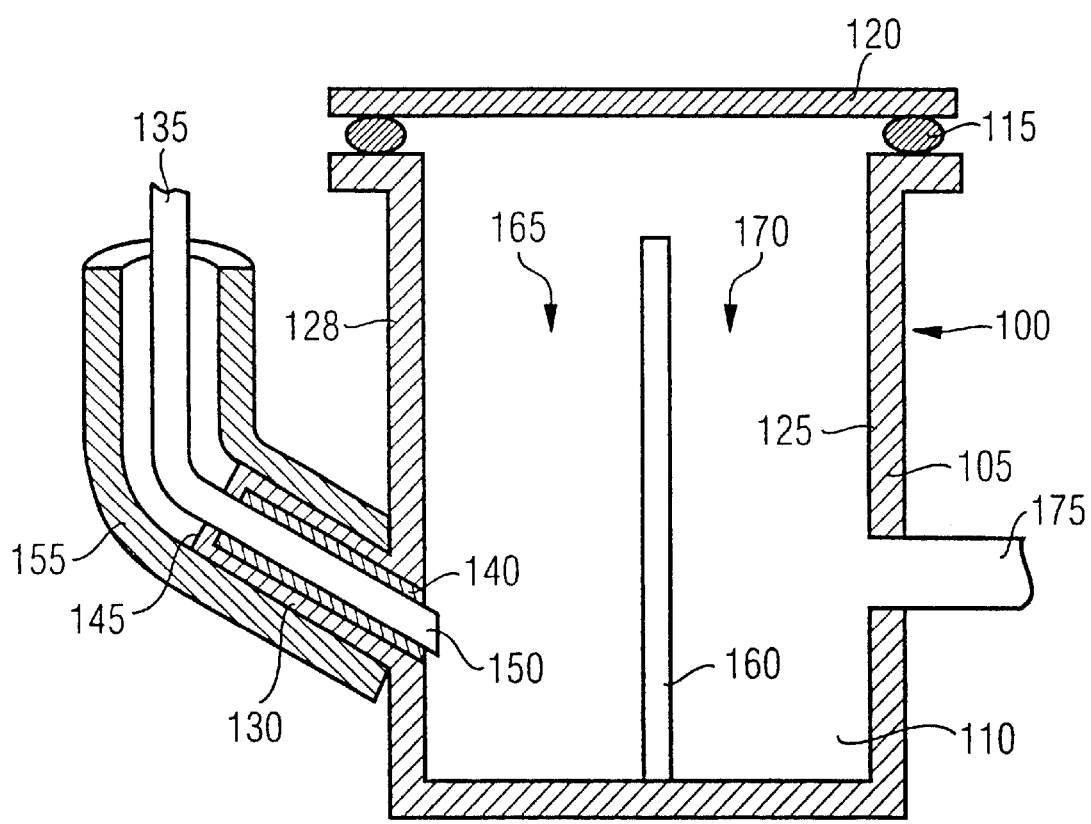
FIG. 2 is a sectional view of a cold trap device according to the invention.

A cold trap 100 according to the invention is represented in FIG. 2. The cold trap 100 comprises a casing 105 which represents the deposition chamber 110 of pot-shaped design. The reaction chamber or deposition chamber 110 is closed by a cover 120 provided with seals 115. The inner casing side 125 on the same side as the deposition chamber 110 represents in this case the cooled inner wall 125 for the deposition of the substances.

A connector 130 in the form of a tubular sleeve is connected to an outside 128 of the casing of the cold trap 100. Through this connector, the line 135 representing the feed 135 passes into the deposition chamber 110. The thermal insulation 140 is contained between the line 135 and the connector 130. The connector 130, at its opposite end 145 from the cold trap 100, encloses the line 135. In contrast to this, the line 135 has no further contact with the connector 130, or with the inner casing side 125 of the deposition chamber 110, from this end 145 to the delivery end 150 of the line 135. As a result, the line 135 is kept at its preselected transport temperature as far as its delivery end 150. Since the end 145 of the connector 130 is at the same temperature as the line 135, a temperature gradient is formed along the connector 130 between the transport temperature of the line 135 and the significantly lower deposition temperature of the inner casing side 125. Owing to the thermal insulation 140, the line 135 is insulated from this temperature gradient as far as its delivery end 150. In order to maintain the transport temperature inside the line 135, the connector 130 and the line 135 are enclosed by a heater 155. As a result of this, the connector 130 is actually heated to the transport temperature, so that a temperature gradient is formed inside the inner casing side 125 starting from the end of the connector 135 next to the cold trap 100. The transport temperature is preferably between 180° C. and 250° C. In contrast to this, the deposition temperature is below 160° C.

The deposition temperature may of course have lower values, for example 120° C., 100° C., 80° C. or even 20° C.

Additional temperature control of the inner casing side 125 is not necessary in the latter case. If desired, the deposition temperature may even be brought below 20° C. using suitable refrigeration devices, e.g. to 0° C. or −20° C.

The thermal insulation 140 preferably consists of compressed insulant. In order to prevent contamination of the deposition chamber 110 by insulant particles, the thermal insulation 140 is sealed off from the deposition chamber 110. In the simplest case, the thermal insulation 140 is a gas. It is not in this case necessary to seal the thermal insulation off from the deposition chamber 110. The deposition chamber 110 is then sealed off at the end 145 of the connector 130.

To further improve the deposition conditions for the process gases, an impact plate 160 is provided in the deposition chamber 110. This impact plate 160, representing the partition 160, causes deflection of the incoming process gases inside the deposition chamber 110. The impact plate 160 preferably divides the deposition chamber 110 into two compartments 165 and 170, which can communicate with one another only at their tops. As a result of this, it is not until having flowed through the compartment 165 that the gases to be deposited enter the second compartment 170 and can there leave the deposition chamber 110 through the outlet opening 175. The incoming substances are preferentially deposited on the impact plate 160, so that the impact plate 160 assumes the function of the inner wall at the same time.

Another way of feeding the line 135 into the deposition chamber 110 is represented in FIG. 3. In this FIG., the connector 130 does not have any direct contact with the line 135. Instead, the heater 155 is arranged between the two. This heater at the same time represents the thermal insulation 140 between the line 135 and the connector 130. In the embodiment represented here, the temperature gradient is only formed inside the connector 130 and in parts of the casing 105. The line 135 protrudes with its delivery end 150 to a certain extent beyond the inner casing side 125, so that any process gases draining from it which have already condensed cannot be precipitated on the inner casing side 125. A heating strip wound around the line 135 or around the connector 130 is preferably used as the heater.

Another configuration of the feed is represented in FIG. 4. In this FIG., the thermal insulation 140 is integrated in the casing 105. The line 135 does not in this case pass fully through the thermal insulation 140, but only as far as its middle. In continuation of the line 135, the thermal insulation 140 has a through-bore 180 leading to the deposition chamber. In combination with the line 135, this bore forms the feed 135 which extends as far as the deposition chamber 110. In this embodiment, a temperature gradient is created only inside the thermal insulation 140, so that the process gases 20 can be fed as far as the deposition chamber 110 via a feed kept at the transport temperature. It is particularly advantageous to provide the thermal insulation 140 with a heater in this embodiment.

FIG. 5 represents another, particularly simple configuration of the connector 130. The connector 130 in this case encloses the line 135 at its opposite end 145 from the cold trap and, this being the case, seals off the deposition chamber 110 from the surroundings. Along its path from the opposite end 145 of the connector 130 from the cold trap as far as the delivery end 150 of the line 135, the latter has no further contact with the connector 130, the casing 105 or the inner wall 125. The hot line 135 is accordingly separated by the cavity 140, which here represents the thermal insulation 140, from the cool casing 105 and the inner wall 125. The temperature gradient between the line 135 and the inner wall 125 is formed along the connector 130. In this case, the opposite end 145 from the cold trap is at the transport temperature.

I claim:

1. A device for depositing substances, comprising:
   a housing having a deposition chamber with an inner wall maintained at a given deposition temperature for depositing substances thereon, said deposition chamber having an outside, an outlet opening, and a connector on said outside;
   a feed having a delivery end extending to said deposition chamber for introducing the substances to be deposited into said deposition chamber, said feed being maintained at a transport temperature above the given deposition temperature, wherein a deposition of the substances is substantially prevented at the transport temperature; and
   a thermal insulation between said feed and said inner wall for preventing said delivery end of said feed from being cooled to the given deposition temperature, said delivery end of said feed protruding through said connector to said deposition chamber, and said thermal insulation thermally insulating said delivery end from said connector.

2. The device according to claim 1, wherein said thermal insulation is adapted to prevent a cooling of said delivery end to below the transport temperature.

3. The device according to claim 1, wherein said feed is a feed line, and including a heater enclosing said feed line.

4. The device according to claim 3, wherein said heater is disposed around said connector.

5. The device according to claim 3, wherein said heater is disposed between said connector and said feed.

6. The device according to claim 1, wherein said feed extends downwardly into said deposition chamber.

7. The device according to claim 1, which further comprises a partition disposed in said deposition chamber between said feed and said outlet opening.

8. A method for depositing substances, which comprises:
   providing a deposition device having a housing with a deposition chamber, the deposition chamber having an outside, an inner wall, an outlet opening, and a connector on the outside;
   maintaining the inner wall at a given deposition temperature for depositing substances on the inner wall;
   introducing the substances to be deposited into the deposition chamber through a feed having a delivery end extending to the deposition chamber, the delivery end protruding through the connector and into the deposition chamber;
   maintaining the feed at a transport temperature above the given deposition temperature, wherein a deposition of the substances is substantially prevented at the transport temperature;
   preventing the delivery end of the feed from being cooled to the given deposition temperature with a thermal insulation disposed between the feed and the inner wall, the thermal insulation thermally insulating the delivery end from the connector; and
   depositing the substances in gas phase at the transport temperature.

9. The method according to claim 8, wherein the transport temperature lies above the evaporation temperature of the substances to be deposited and the given deposition temperature lies below the melting temperature of the substances to be deposited.

10. The method according to claim 8, which further comprises preselecting the deposition temperature such that at least one precursor required for forming oxide ceramics can be deposited on the inner wall.

11. The method according to claim 8, wherein the deposition temperature lies below 160° C.

12. The method according to claim 10, wherein the at least one precursor is a substance selected from the group consisting of:

$Biph_3$, $Bi(thd)_3$;
$Ti(thd)_2(OiPr)_2$, $Ti(OiPr)_4$, $Ti(O)(thd)_2$;
$Ta(thd)(OiPr)_4$, $Ta(OEt)_5$;
$Pb(thd)_2$;
$Zr(thd)_4$, $Zr(OtBu)_4$; and
$M(thd)_2(R)$, $M(thd)_2$, where:

M is an element selected from the group consisting of barium and strontium,

Ph is phenyl;

thd is 2,2,6,6-tetramethylheptane-3,5-dionate;

OiPr is isopropoxide;

OEt is ethoxide;

OtBu is tertiary butoxide; and

R is bis-(2-(2-methoxyethyl)ethyl) ether or N,N,N',N",N'-pentamethyl-bis-(2-aminoethyl)amine.

* * * * *